United States Patent
Ruan et al.

(10) Patent No.: US 11,300,603 B2
(45) Date of Patent: Apr. 12, 2022

(54) METHOD AND SYSTEM FOR CONDITION MONITORING ELECTRICAL EQUIPMENT

(71) Applicant: ABB Schweiz AG, Baden (CH)

(72) Inventors: Jiayang Ruan, Beijing (CN); Niya Chen, Beijing (CN); Rongrong Yu, Beijing (CN); Kai Hencken, Lörrach (DE); Joerg Lehmann, Basel (CH)

(73) Assignee: ABB SCHWEIZ AG, Baden (CH)

( * ) Notice: Subject to any disclaimer, the term of this patent is extended or adjusted under 35 U.S.C. 154(b) by 0 days.

(21) Appl. No.: 17/178,521

(22) Filed: Feb. 18, 2021

(65) Prior Publication Data
US 2021/0199707 A1    Jul. 1, 2021

Related U.S. Application Data

(63) Continuation of application No. PCT/CN2018/122180, filed on Dec. 19, 2018.

(51) Int. Cl.
*G01R 31/12* (2020.01)

(52) U.S. Cl.
CPC ................. *G01R 31/1272* (2013.01)

(58) Field of Classification Search
CPC ............ G01R 31/1272; G01R 31/1263
See application file for complete search history.

(56) References Cited

U.S. PATENT DOCUMENTS

| | | | |
|---|---|---|---|
| 2013/0179100 A1 | 7/2013 | Guo | |
| 2016/0274176 A1 | 9/2016 | Di Stefano et al. | |
| 2019/0285683 A1* | 9/2019 | Kim | G01R 19/0092 |
| 2020/0003822 A1* | 1/2020 | Maret | G01R 31/1272 |

(Continued)

FOREIGN PATENT DOCUMENTS

| | | | |
|---|---|---|---|
| CN | 102445640 A | | 5/2012 |
| CN | 102735999 A | | 10/2012 |
| CN | 102841296 A | * | 12/2012 |

(Continued)

OTHER PUBLICATIONS

State Intellectual Property Office of the P.R. China, International Search Report & Written Opinion issued in corresponding Application No. PCT/CN2018/122180, dated Sep. 27, 2019, 5 pp.

*Primary Examiner* — Natalie Huls
*Assistant Examiner* — Michael J Singletary
(74) *Attorney, Agent, or Firm* — Greenberg Traurig, LLP

(57) ABSTRACT

A method and system for condition monitoring electrical equipment includes detecting partial discharge impulses generated in the electrical equipment for at least one power cycle; obtaining first data representing the detected partial discharge impulses for the at least one power cycle; obtaining second data by phase-resolving the first data; obtaining third data by regularizing the second data; analyzing the third data into a first component and at least one second component; obtaining phase information of the first component; shifting the first component and the at least one second component in consideration of the obtained phase information; and generating a signal indicating a health state of the electrical equipment by comparing the shifted first and second components of the third data with their counterparts associated with an unhealthy electrical equipment.

24 Claims, 9 Drawing Sheets

(56) References Cited

U.S. PATENT DOCUMENTS

2021/0364566 A1* 11/2021 Hencken ............ G01R 31/1272
2021/0405106 A1* 12/2021 Hencken ............ G01R 31/1209

FOREIGN PATENT DOCUMENTS

| | | | |
|---|---|---|---|
| CN | 102841296 A | | 12/2012 |
| CN | 103543393 A | | 1/2014 |
| CN | 105044567 A | | 11/2015 |
| CN | 105137306 A | | 12/2015 |
| CN | 105683766 A | | 6/2016 |
| CN | 105785236 A | | 7/2016 |
| CN | 106646169 A | | 5/2017 |
| JP | 2001343418 A | | 12/2001 |
| JP | 2006250870 A | | 9/2006 |
| KR | 20180080567 A | * | 7/2018 |

* cited by examiner

METHOD AND SYSTEM FOR CONDITION MONITORING ELECTRICAL EQUIPMENT

FIELD

Example embodiments of the present disclosure generally relate to condition monitoring and more particularly, to a method and system for condition monitoring electrical equipment.

BACKGROUND

In electrical equipment, such as a circuit breaker (CB), dielectric breakdown may happen in places like surface or inside of solid insulation material, or any parts that are under electrical stress. Partial discharge (PD) is a localized dielectric breakdown of a small portion of a solid or fluid electrical insulation system under high voltage stress, which does not bridge the space between two conductors. Protracted partial discharge can erode solid insulation and eventually lead to breakdown of insulation.

Measurement of partial discharge is a good indication of exposing pre-fault dielectric problems. With the partial discharge monitoring (PDM), the dielectric condition of high voltage equipment can be evaluated. To ensure supply reliability and long-term operational sustainability, PD in electrical equipment should be monitored closely with early warning signals for inspection and maintenance.

Methods for partial discharge monitoring have been studied for a long time. Most of the methods require detecting additional signals, such as a synchronization signal from a potential transformer (PT) via cumbersome wire routing. Some methods may not detecting additional signals, but use delicate high-sampling-rate devices to analyze each individual partial discharge impulse waveform. This can result in a complicated system for condition monitoring, and increasing condition monitoring cost.

For example, CN102445640A describes a classifier, which requires massive data and directly uses a phase-resolved partial discharge (PRPD) image as a input feature. This can result in an increase in costs. CN105785236A describes an external signal interference excluding method for detecting partial discharge. It requires an ultra-high-resolution data acquisition system.

SUMMARY

Example embodiments of the present disclosure propose a solution for condition monitoring electrical equipment.

In a first aspect, example embodiments of the present disclosure provide a method for condition monitoring electrical equipment. The method comprises detecting partial discharge impulses generated in the electrical equipment for at least one power cycle; obtaining first data representing the detected partial discharge impulses for the at least one power cycle; obtaining second data by phase-resolving the first data; obtaining third data by regularizing the second data; analyzing the third data into a first component and at least one second component; obtaining phase information of the first component; shifting the first component and the at least one second component in consideration of the obtained phase information; and generating a signal indicating a health state of the electrical equipment by comparing the shifted first and second components of the third data with their counterparts associated with an unhealthy electrical equipment.

In some embodiments, the phase information of the first component comprises a phase angle of the first component, and wherein shifting the first component and the at least one second component comprises: synchronously shifting the first component and the at least one second component to change the phase angle of the first component to a predetermined value.

In some embodiments, obtaining the third data comprises: iteratively performing the following one or more times: determining a ratio between a valley and a peak of magnitudes of the detected partial discharge impulses, the magnitudes being below a reference value; if the ratio is inconsistent with a target ratio, decreasing the reference value; and de-nosing the partial discharge impulses by removing impulses with the magnitudes below the reference value.

In some embodiments, obtaining the first data comprises: obtaining a frequency of a grid in which the electrical equipment operates; generating a synchronization signal, a frequency of the synchronization signal synchronized with the frequency of the grid; and generating the first data by recording the detected partial discharge impulses and phase information of the synchronization signal corresponding to the detected partial discharge impulses.

In some embodiments, obtaining the frequency of the grid comprises: performing a Fourier transform on the detected partial discharge impulses; and calculating the frequency of the grid in consideration of a frequency of an impulse with a maximum magnitude among the transformed partial discharge impulses as the frequency of the grid.

In some embodiments, obtaining the second data comprises: determining, from the first data, phase angles of the partial discharge impulses; shifting the phase angles of the partial discharge impulses to within one power cycle; and recording the partial discharge impulses and the shifted phase angles to obtain the second data.

In some embodiments, the third data comprise a histogram of the second data, the histogram representing a distribution of magnitudes of the detected partial discharge impulses over phase angles of the detected partial discharge impulses.

In some embodiments, the method further comprises in response to the signal indicating that the electrical equipment is in an unhealthy state, incrementing a first count of unhealthy states of the electrical equipment over a period of time; in response to the signal indicating that the electrical equipment is in a healthy state, incrementing a second count of healthy states of the electrical equipment over the period of time; and generating, based on the first count and the second count, a score indicating a cumulative health state of the electrical equipment.

In some embodiments, the method further comprises in response to the signal indicating that the electrical equipment is in an unhealthy state, obtaining one or more properties of the unhealthy electrical equipment: and determining one or more properties of the electrical equipment based on the properties of the unhealthy electrical equipment.

In some embodiments, the one or more properties of the electrical equipment comprise: a type of partial discharge generating the partial discharge impulses and/or a location where partial discharge generating the partial discharge impulses occurs.

In some embodiments, the first component comprises a fundamental wave of the third data, and the at least one second component comprises at least one harmonic of the third data.

In a second aspect, example embodiments of the present disclosure provide a system for condition monitoring an electrical equipment. The system comprises a processing unit. The system also comprises a memory coupled to the processing unit and storing instructions thereon, the instructions, when executed by the processing unit, causing the system to execute acts including: detecting partial discharge impulses generated in the electrical equipment for at least one power cycle; obtaining first data representing the detected partial discharge impulses for the at least one power cycle; obtaining second data by phase-resolving the first data; obtaining third data by regularizing the second data; analyzing the third data into a first component and at least one second component; obtaining phase information of the first component; shifting the first component and the at least one second component in consideration of the obtained phase information; and generating a signal indicating a health state of the electrical equipment by comparing the shifted first and second components of the third data with their counterparts associated with an unhealthy electrical equipment.

In some embodiments, the phase information of the first component comprises a phase angle of the first component, and wherein shifting the first component and the at least one second component comprises: synchronously shifting the first component and the at least one second component to change the phase angle of the first component to a predetermined value.

In some embodiments, obtaining the third data comprises: iteratively performing the following one or more times: determining a ratio between a valley and, a peak of magnitudes of the detected partial discharge impulses, the magnitudes being below a reference value; if the ratio is inconsistent with a target ratio, decreasing the reference value; and de-nosing the partial discharge impulses by removing impulses with the magnitudes below the reference value.

In some embodiments, obtaining the first data comprises: obtaining a frequency of a grid in which the electrical equipment operates; generating a synchronization signal, a frequency of the synchronization signal synchronized with the frequency of the grid; and generating the first data by recording the detected partial discharge impulses and phase information of the synchronization signal corresponding to the detected partial discharge impulses.

In some embodiments, obtaining the frequency of the grid comprises: performing a Fourier transform on the detected partial discharge impulses; and calculating the frequency of the grid in consideration of a frequency of an impulse with a maximum magnitude among the transformed partial discharge impulses as the frequency of the grid.

In some embodiments, obtaining the second data comprises: determining, from the first data, phase angles of the partial discharge impulses; shifting the phase angles of the partial discharge impulses to within one power cycle; and recording the partial discharge impulses and the shifted phase angles to obtain the second data.

In some embodiments, the third data comprise a histogram of the second data, the histogram representing a distribution of magnitudes of the detected partial discharge impulses over phase angles of the detected partial discharge impulses.

In some embodiments, the system further comprises in response to the signal indicating that the electrical equipment is in an unhealthy state, incrementing a first count of unhealthy states of the electrical equipment over a period of time; in response to the signal indicating that the electrical equipment is in a healthy state, incrementing a second count of healthy states of the electrical equipment over the period of time; and generating, based on the first count and the second count, a score indicating a cumulative health state of the electrical equipment.

In some embodiments, the system further comprises in response to the signal indicating that the electrical equipment is in an unhealthy state, obtaining one or more properties of the unhealthy electrical equipment; and determining one or more properties of the electrical equipment based on the properties of the unhealthy electrical equipment.

In some embodiments, the one or more properties of the electrical equipment comprise: a type of partial discharge generating the partial discharge impulses, and/or a location where partial discharge generating the partial discharge impulses occurs.

In some embodiments, the first component comprises a fundamental wave of the third data, and the at least one second component comprises at least one harmonic of the third data.

In a third aspect, example embodiments of the present disclosure provide an Internet of Things (IoT) system. The Internet of Things comprises a system for condition monitoring an, electrical equipment of the second aspect.

In a fourth aspect, example embodiments of the present disclosure provide an electrical equipment. The electrical equipment comprises a system for condition monitoring an electrical equipment of the second aspect. The system is configured to condition monitor the electrical equipment.

In a fifth aspect, example embodiments of the present disclosure provide a computer readable medium having instructions stored thereon, the instructions, when executed on at least one processor, cause the at least one processor to perform the method of the first aspect.

BRIEF DESCRIPTION OF THE DRAWINGS

Through the following detailed descriptions with reference to the accompanying drawings, the above and other objectives, features and advantages of the example embodiments disclosed herein will become more comprehensible. In the drawings, several example embodiments disclosed herein will be illustrated in an example and in a non-limiting manner, wherein.

Throughout the drawings, the same or corresponding reference symbols refer to the same or corresponding parts.

DETAILED DESCRIPTION

Figure 1:
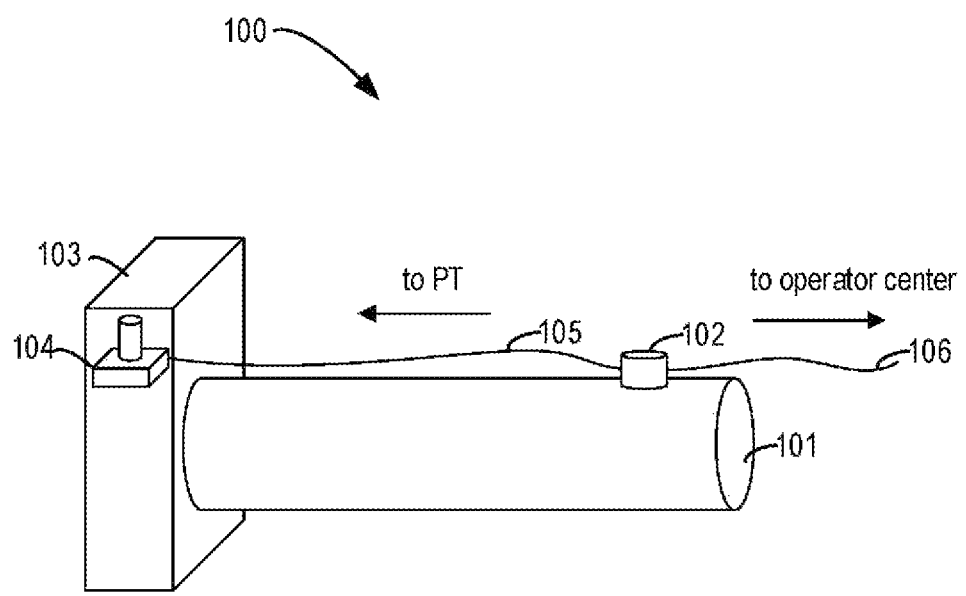
FIG. 1 illustrates a schematic diagram showing wired data transmission mode for a conventional partial discharge monitoring solution.

The subject matter described herein will now be discussed with reference to several example embodiments. These embodiments are discussed only for the purpose of enabling those skilled persons in the art to better understand and thus implement the subject matter described herein, rather than suggesting any limitations on the scope of the subject matter.

The term "comprises" or "includes" and its variants are to be read as open terms that mean "includes, but is not limited to." The term "or" is to be read as "and/or" unless the context clearly indicates otherwise. The term "based on" is to be read as "based at least in part on." The term "being operable to" is to mean a function, an action, a motion or a state can be achieved by an operation induced by a user or an external mechanism. The term "one embodiment" and "an embodiment" are to be read as "at least one embodiment" The term "another embodiment" is to be read as "at least one other embodiment."

Unless specified or limited otherwise, the terms "mounted," "connected," "supported," and "coupled" and variations thereof are used broadly and encompass direct and indirect mountings, connections, supports, and couplings. Furthermore, "connected" and "coupled" are not restricted to physical or mechanical connections or couplings. In the description below, like reference numerals and labels are used to describe the same, similar or corresponding parts in the Figures. Other definitions, explicit and implicit, may be included below.

As mentioned above, it is important to detect partial discharge so as to carry out condition monitoring electrical, equipment. Although many efforts have been devoted to the condition monitoring, most of existing condition monitoring methods have disadvantages in various aspects. For example, most of the methods require detecting additional signals, such as a synchronization signal from, a potential transformer (PT) via cumbersome wire routing.

FIG. 1 illustrates a schematic diagram showing wired data transmission mode for a conventional partial discharge monitoring solution 100. In the conventional partial discharge monitoring solution 100, a partial discharge monitoring module 102, such as Ultra High Frequency (UHF) sensor, is mounted on a case of electrical equipment 101. The partial discharge monitoring module 102 is connected to a potential transformer 104 via a wire 105. The potential transformer 104 is located in a control cabinet for the electrical equipment 101. The partial discharge monitoring module 102 is connected to an operator center via a wire 106.

When partial discharge impulses are detected by the partial discharge monitoring module 102, the partial discharge monitoring module 102 needs to obtain a synchronization signal from the potential transformer 104. Based on the detected partial discharge impulses and the synchronization signal, partial discharge monitoring is carried out. A conventional partial discharge monitoring solution will be described in detail below with reference to the FIGS. 2A-2C.

Figure 2A:
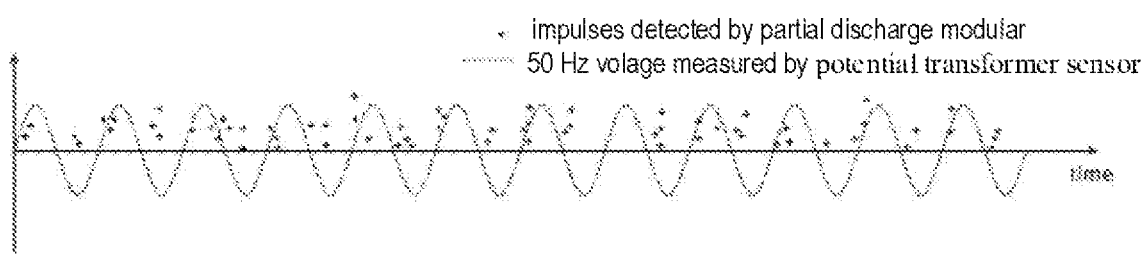
FIG. 2A illustrates a distribution of magnitudes of the detected partial discharge impulses over time for a conventional partial discharge monitoring solution.

In a FIG. 2A, when the electrical stress is excited by a 50 Hz sinusoidal voltage, several partial discharge impulses can be detected by the partial discharge monitoring module 102. Each impulse is generated by a partial discharge event. Dining every power cycle, these events may randomly occur at any instant (phase angle), and their magnitudes may be uncertain as well, Phase angles and magnitudes of the impulses are different for various partial discharge types (partial discharge occurring at different places like surface, intrusion, or inside insulation).

Figure 2B:
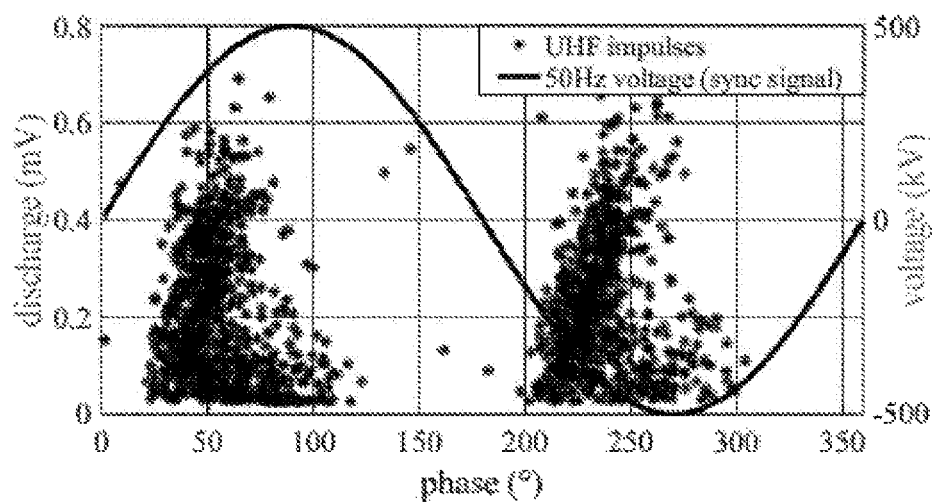
FIG. 2B illustrates a phase resolved-partial discharge image of a synchronization signal for a conventional partial discharge monitoring solution.

When these impulses are drawn within only one power cycle, a phase-resolved partial discharge (PRPD) image is obtained, as shown in FIG. 2B. The PRPD image is generated by recording the detected partial discharge impulses and phase angles of the synchronization signal corresponding to the detected partial discharge impulses.

Figure 2C:
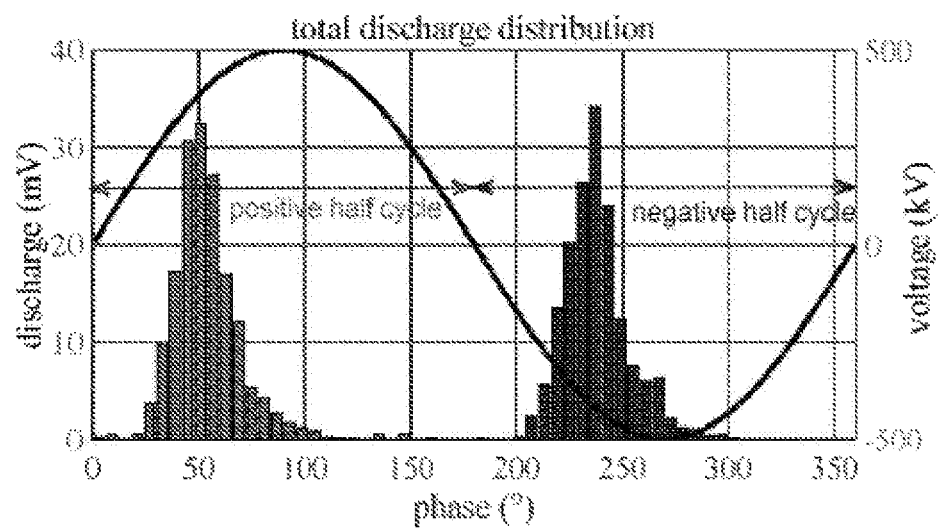
FIG. 2C illustrates a histogram for a conventional partial discharge monitoring solution.

Then the PRPD image may be converted into a histogram, as shown in FIG. 2C. The histogram represents a distribution of magnitudes of the detected partial discharge impulses over phase angles of the detected partial discharge impulses. The shape of histogram is characteristic compared to when no partial, discharge occurs. The conventional monitoring solution extracts shape features from the histogram and carries out partial discharge monitoring.

That is, for the conventional system and solution, a 50 Hz synchronization signal measured from the potential transformer 104 is unavoidable, Yet the potential transformer 104 is not always easy to access in electrical equipment 101. Furthermore, the voltage measured from the potential transformer 104 might not always be phase-consistent with the electrical stress applied on insulation. This can result in a monitoring error and increase condition monitoring cost.

According to embodiments of the present disclosure, there is provided a solution for condition monitoring electrical equipment. In this solution, features of the partial discharge impulses composed of its normalized histogram harmonics are extracted, based on an internal synchronization signal with a detected frequency of a grid. The features of the partial discharge impulses are shifted in consideration of their phase information. A signal indicating a health state of the electrical equipment is generated by comparing the shifted features of the partial discharge impulses with their counterparts associated with an unhealthy electrical equipments. In this way, it is helpful for monitoring the health state of the electrical equipment in a precise manner without relying on potential transformer signal for synchronization, thus facilitates quicker and easier deployment of the distributed partial discharge monitoring system. Example embodiments of the present disclosure will be described in detail below with reference to the figures.

Figure 3:
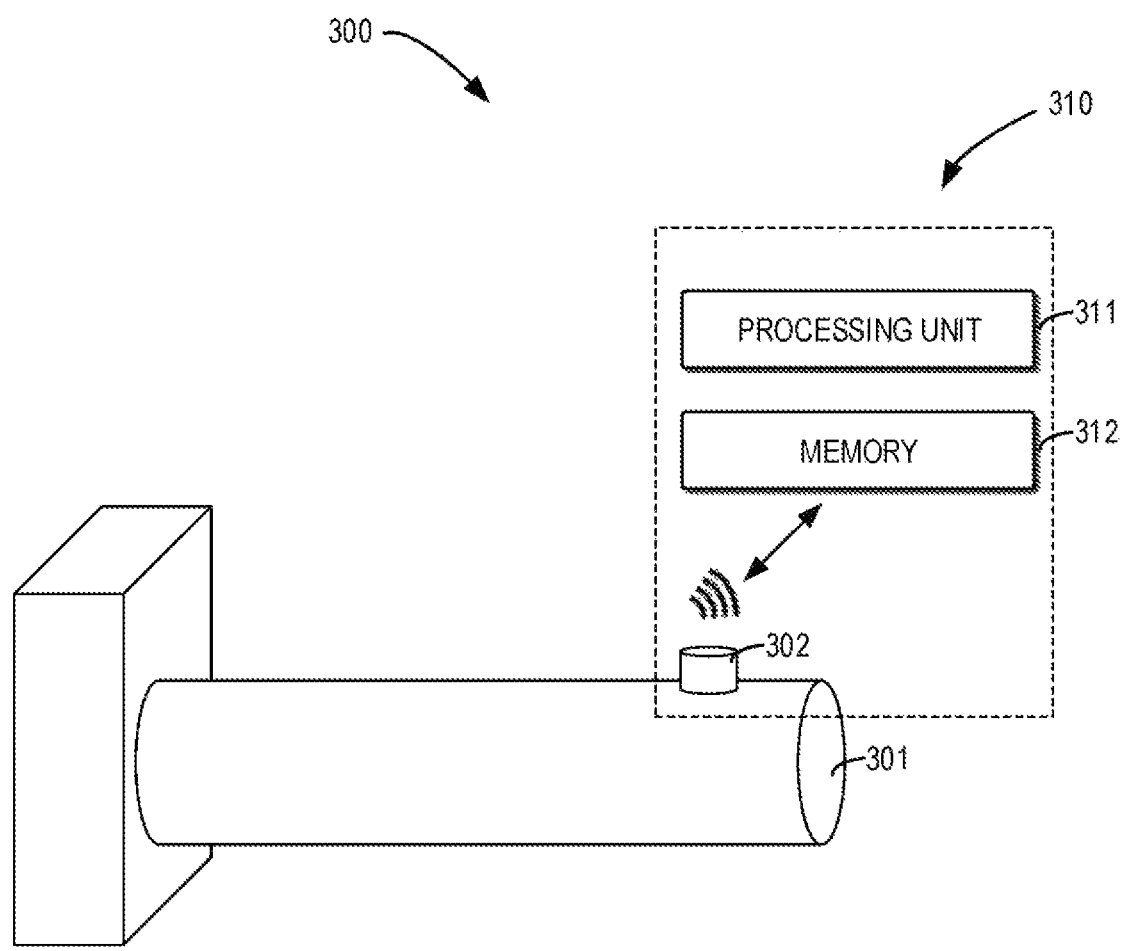
FIG. 3 illustrates a system for condition monitoring electrical equipment in accordance with some example embodiments of the present disclosure.

FIG. 3 illustrates a system 300 for condition monitoring electrical equipment in accordance with some example embodiments of the present disclosure. The system 300 includes electrical equipment 301 and a system 310 for condition monitoring electrical equipment 301. In some embodiments, the system 300 may be deployed as an Internet-of-Things (IoT) system. Although one set of electrical equipment 301 is shown, in some embodiments, more than one set of electrical equipment may be included and connected to the system 310 to monitor the condition. Alternatively, in other examples, more than one system may be included to monitor the respective sets of electrical equipment in the system 300. Although the electrical equipment 301 and the system 310 are shown as being separate in the figure, in some embodiments, the electrical equipment 301 can include the system 310.

The electrical equipment 301 to be monitored may be any type of electrical equipment, such as a circuit breaker (CB), a power converter, and the like.

As illustrated in FIG. 3, the system 310 includes a detecting unit 302. The detecting unit 302 is configured to detect partial discharge impulses generated in the electrical equipment 301. Herein the detecting unit 302 may be any type of detecting unit, such as a Ultra High Frequency (UHF) sensor, a Transient Earth Voltage (TEV) sensor or a High Frequency Current Transformer (HFCT), and the like. The detecting unit 302 is mounted on a case (or other positions easy to access) of the electrical equipment 301. The detecting unit 302 detects partial discharge impulses generated in the electrical equipment 301, and communicates with as a processing unit 311, through wireless channels like Bluetooth, Wi-Fi or wired channels.

The system 310 further includes the processing unit 311 and a memory 312. In some embodiments, the memory 312 is configured to store instructions. The instructions are executed by the processing, unit 311, causing the system 310 to monitor the condition of the electrical equipment 301, as will be described below. The processing unit 311 may be any type of processing unit, such as a controller, a microcontroller or a Digital Signal Processor (DSP), and the like. It is to be understood that, the system 310 may include other units and/or modules not, shown in FIG. 3, such as a communication unit, an input/output unit, and the like.

Figure 4:
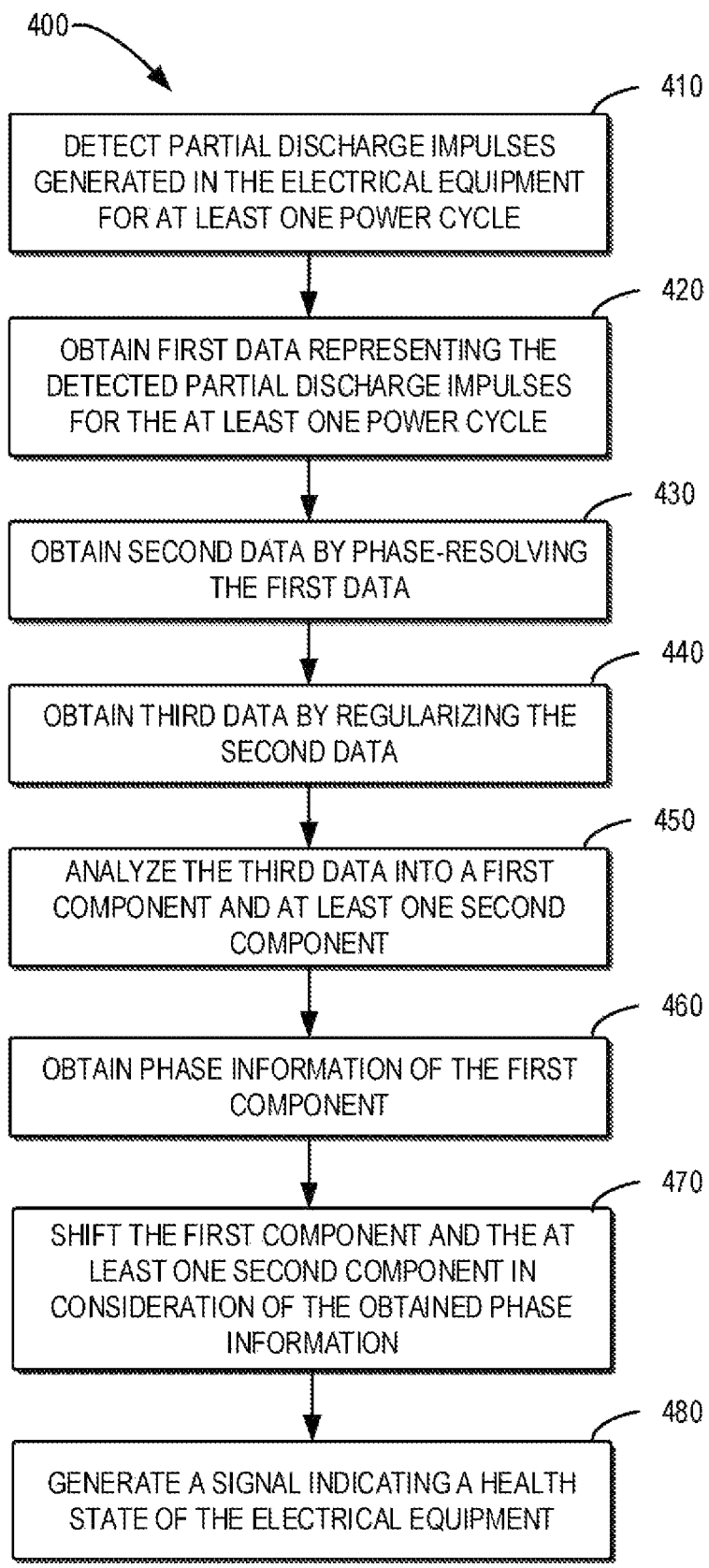
FIG. 4 illustrates a flowchart of a process of condition monitoring electrical equipment in accordance with some example embodiments of the present disclosure.

FIG. 4 illustrates a flowchart of a process of condition monitoring electrical equipment 301 with some example embodiments of the present disclosure. In some embodiments, the process 400 may be implemented in software and/or firmware by means of, for example, a system 310.

At block 410, partial discharge impulses are detected by the system 310. In some embodiments, partial discharge impulses are generated in the electrical equipment 301 for at least one power cycle, During every power cycle, these partial discharge impulses may randomly occur at any phase angle, and their magnitudes may be uncertain as well.

At block 420, the system 310 obtains first data representing the detected partial discharge impulses for the at least one power cycle. In some embodiments, in order to obtain the first data, it is required to have a synchronization signal with a frequency synchronized with a frequency of a grid. If a fixed-frequency 50 Hz waveform is used as the synchronization signal, most of the detected partial discharge impulses would become noises. This is because the real frequency of the grid may be deviated from 50 Hz. In this case, the system 310 would not be able to accurately monitor the condition of the electrical equipment 301.

There are a variety of ways to obtain the real frequency of the grid. In some embodiments, a Fourier transform may be applied on the detected partial discharge impulses. Then the frequency of the grid in consideration of a frequency of an impulse with a maximum magnitude among the transformed partial discharge impulses is determined as the frequency of the grid.

Figure 5A:
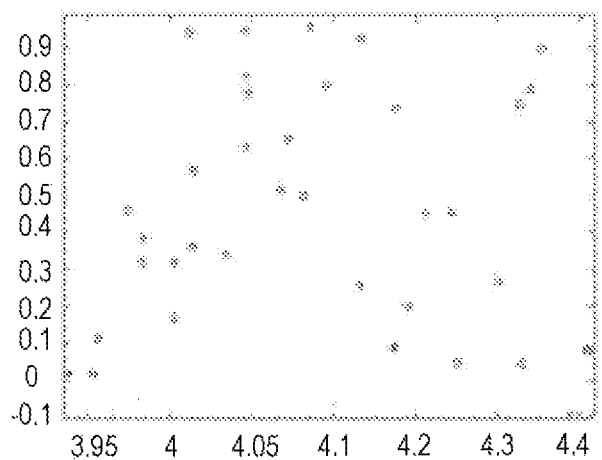
FIG. 5A illustrates a diagram showing detected partial discharge impulses in accordance with some example embodiments of the present disclosure.

FIG. 5A illustrates a diagram showing the detected partial discharge impulses in accordance with some example embodiments of the present disclosure. As shown in FIG. 5A, the horizontal axis represents time, the vertical axis represents magnitude, and the dots represent the detected partial discharge impulses.

Figure 5B:
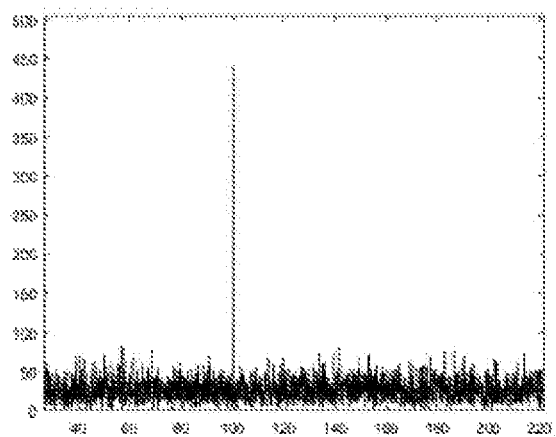
FIG. 5B illustrates a diagram showing a Fourier transform result of the detected partial discharge impulses of FIG. 5A in accordance with some example embodiments of the present disclosure.

FIG. 5B illustrates a diagram showing a Fourier transform result of the detected partial discharge impulses of FIG. 5A in accordance with some example embodiments of the present disclosure. In FIG. 5B, the horizontal axis represents frequency, the vertical axis represents magnitude.

In some embodiments, the system 310 can selected a frequency of an impulse with a maximum magnitude among the transformed partial discharge impulses. It is to be noted that the selected raw frequency is twice the frequency of the grid, because the partial discharge impulses are generated from non-polarity sensors like UHF. Thus, if a non-polarity type sensor is used to detect the partial discharge impulses, the frequency of the grid should be half of the frequency of the impulse with a maximum magnitude, as shown in FIG. 5B. Alternatively, or in addition, if a polarity type sensor is used to detect the partial discharge impulses, the frequency of the grid should be the frequency of the impulse with a maximum magnitude. In this way, the system 310 can directly obtain the accurate frequency of the grid without accessing the potential transformer to obtain a synchronization signal. Therefore the detection accuracy is improved while the cost is reduced.

Alternatively, in other embodiments, an antenna, for example a floating metal, can be added to the detecting unit 302. Therefore, the detecting unit 302 can sense the alternating ambient electromagnetic field. A frequency of a sensed fundamental waveform may be obtained as the frequency of the grid.

Figure 5C:
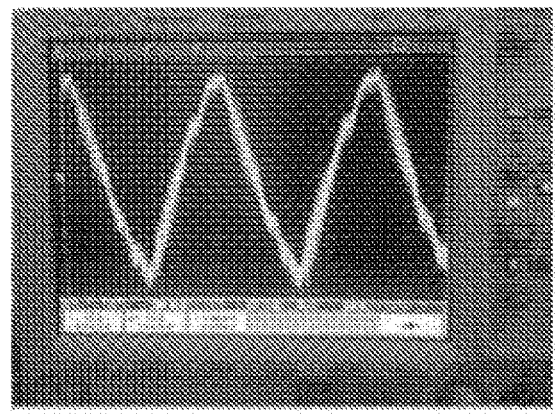
FIG. 5C illustrates a voltage waveform displayed by an oscilloscope in accordance with some example embodiments of the present disclosure.

FIG. 5C illustrates a voltage waveform displayed by an oscilloscope in accordance with some example embodiments of the present disclosure. The waveform shown in this figure is the sensed fundamental waveform. The system can obtain the frequency of the fundamental wave directly as the frequency of the grid. In this way, the system 310 can directly obtain the accurate frequency of the grid without relying on occurrence of the partial discharge.

It is to be understood that the above two approaches of detecting the frequency of the grid are merely examples. Any other appropriate approaches can be used to detect the frequency of the grid.

In some embodiments, because the system 310 does not obtain the synchronization signal from the potential transformer, as illustrated in FIG. 3, an internal synchronization signal is required to be generated. As mentioned above, the system has obtained the frequency of the grid. An internal synchronization signal can be generated based on the frequency of the grid. For example, the frequency of the grid is used as the frequency of the internal synchronizing signal, and the arbitrary phase angle and the arbitrary magnitude are used as the phase angle and magnitude of the internal synchronizing signal. Then the system 310 can obtain the first data by recording the detected partial discharge impulses and the phase angle of the internal synchronization signal corresponding to the detected partial discharge impulses.

Figure 5D:
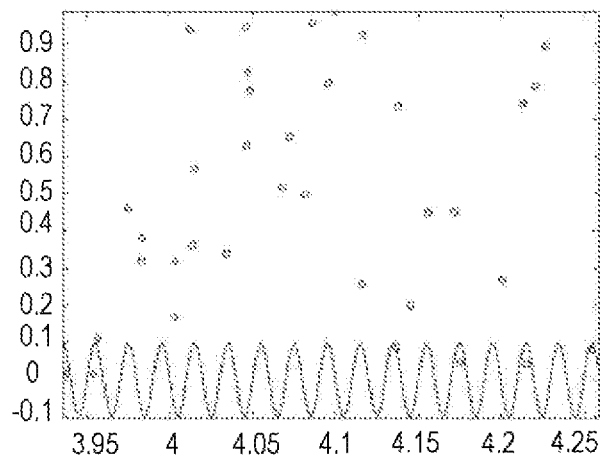
FIG. 5D illustrates a diagram showing first data in accordance with some example embodiments of the present disclosure.

FIG. 5D illustrates a diagram showing the first data in accordance with some example embodiments of the present disclosure. The dots represent the detected partial discharge impulses, and the sine wave represents the internal synchronization signal. Compared to the example in FIG. 5A, the example of FIG. 5D records not only the detected partial discharge impulses but also the phase angles corresponding to these impulses. In this way, the system 310 does not require to access the potential transformer via a additional wire, thus reduces costs.

Still in reference to FIG. 4, at block 430, the system 310 obtains second data by phase-resolving the first data obtained at block 420. In some embodiments, in order to facilitate the analysis of the data, it is necessary to shift the partial discharge impulses from a plurality of power cycles into one power cycle. For example, in the first data as shown in FIG. 5D, the phase angles of the partial discharge impulses in each power cycle can be obtained from the phase angle of the internal synchronization signal corresponding to the impulses. Then, the phase angles of the partial discharge impulses are shifted to within one power cycle. Accordingly, the partial discharge impulses and the shifted phase angles are recorded to obtain the second data.

Figure 6A:
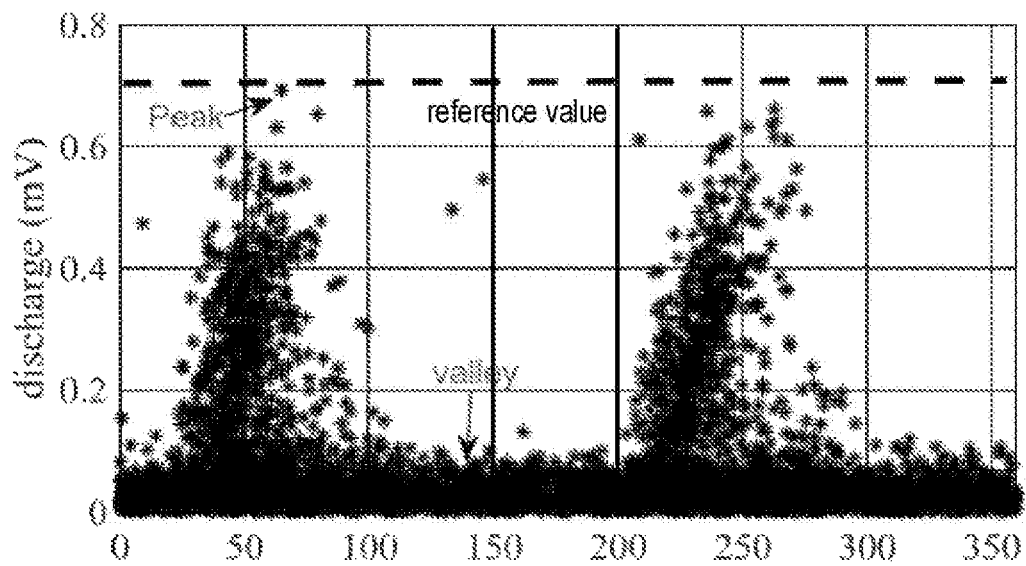
FIG. 6A-6B illustrate diagrams showing second data in accordance with some example embodiments of the present disclosure.
Figure 6B:
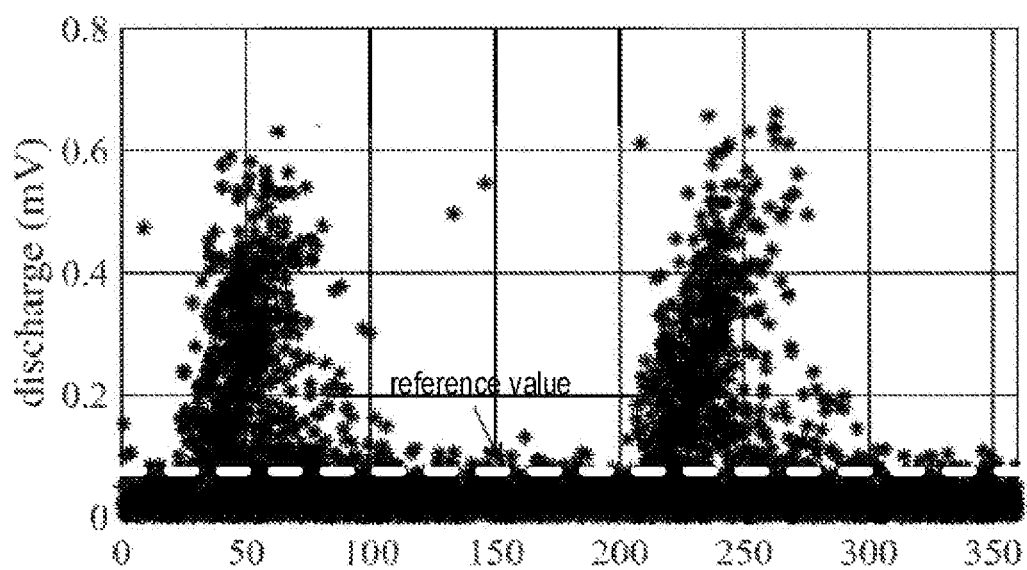

For example, the system 310 shifts the partial discharge impulses as illustrated in FIG. 5D into one power cycle, and, the second data can be obtained as illustrated in FIGS. 6A and 6B. FIG. 6A and FIG. 6B illustrate that the partial discharge impulses from the first data are shifted within only one power cycle, i.e., only phase-resolved information remains, thus the diagram illustrated in FIG. 6A and FIG. 6B can be named as a phase-resolved partial discharge (PRPD) image.

Still in reference to FIG. 4, at block 440, the system 310 obtains third data by regularizing the second data obtained at block 430. In some embodiments, in order to improve the efficiency and accuracy of the condition monitoring, a de-nosing process may be performed. For example, a ratio between a valley and a peak, of those magnitudes below a reference value of the detected partial discharge impulses may be determined. If the ratio is inconsistent with a predetermined target ratio, then the reference value can be decreased. This procedure can be iteratively performed one or more times until the ratio is consistent with the predetermined target ratio. It is to be understood that the predetermined target ratio can comprise any appropriate ratio, and be obtained empirically or experimentally.

For example, FIG. 6A and FIG. 6B illustrate the variation of the reference value. As shown in FIG. 6A, an initial reference value is set at the peak of magnitudes of the detected partial discharge impulses. After the above procedure is iteratively performed, the initial reference value is reduced to the final reference value. The final reference value can seen clearly in FIG. 6B. The system 310 de-noises the partial discharge impulses by removing impulses with the magnitudes below the final reference value. In this way, the useless noisy impulses can be simply removed. Alternatively, in other embodiments, in order to simplify the process, the de-noising process may not be performed.

In some embodiments, the third data obtained at block 440 may comprise a histogram of the second data. For example, the histogram can represent a distribution of magnitudes of the detected partial, discharge impulses over phase angles of the detected partial discharge impulses (i.e., Q histogram, Q represents impulse magnitude). Alternatively, or in addition, the histogram can represent a distribution of numbers of the detected partial discharge impulses over phase angles of the detected partial discharge impulses (i.e., N histogram, N represents impulse number).

Figure 7A:
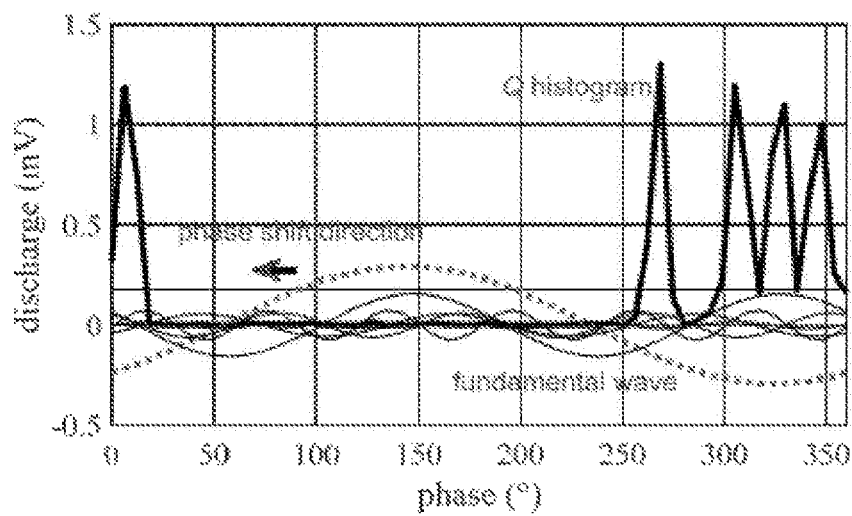
FIG. 7A illustrates a diagram showing a histogram and components in accordance with some example embodiments of the present disclosure.

FIG. 7A shows an example of the Q histogram. The line with several pointed vertices represents Q histogram. FIG. 2C shows other example of the Q histogram. The horizontal axis represents phase angles and the vertical axis represents magnitudes. In order to construct the Q histogram, the system 310 divides the one power cycle into a series of intervals, also known as bins. The magnitudes of the impulses in each bin are accumulated as the length of each bin. In this way, the three-dimensional second data having the numbers, magnitudes, and phase angles of the impulses can be converted into the two-dimensional third data having magnitudes and phase angles.

Still in reference to FIG. 4, at block 450, the third data are analyzed into a first component and at least one second component by the system 310. In some embodiments, the first component comprises a fundamental wave of the third data, and the at least one second component comprises at least one harmonic. It is to be understood that the fundamental wave and the at least one harmonic are merely examples. The first component and the at least one second component can be any other appropriate component.

The system 310 determines a series of coefficients of the third data by performing decomposition on the third data. In some embodiments, the coefficients may be Fourier series coefficients and the decomposition may be Fourier series decomposition. In some embodiments, the coefficients may be complex numbers. The magnitudes and phase angles of the components can be obtained from the real parts and the imaginary parts of the complex numbers. Therefore, a coefficient can represent a component. That is, the components can be obtained by performing decomposition on the third data. In this way, the complicated data can be decomposed into waveforms that can be easily analyzed by the system 310.

It is to be understood that not all components are helpful for performing monitoring. Therefore, in some embodiments, harmonics less than or equal to $n^{th}$ order are retained and a direct current (DC) component is removed. The value n can be any appropriate value. For example, the value n can be 6.

In some embodiments, the coefficients are normalized in order to improve the efficiency of monitoring. For example, the system 310 scales up or down the magnitude of the fundamental wave to a reference value (for example, 0.5 or 1 mV) in a proportion. Then the magnitudes of all other harmonics can be scaled up or down in the same proportion. In this way, all components are normalized to a unified scale, so as to facilitate subsequent monitoring steps.

Still in reference to FIG. 4, at block 460, phase information of the first component is obtained by the system 310. In some embodiments, the phase information comprises a phase angle of the first component. As mentioned at block 450, the coefficients are complex numbers, the magnitudes and phase angles of the components can be obtained from the real parts and the imaginary parts of the complex numbers. Therefore, the phase information of the first component is obtained from the coefficients obtained at block 450.

At block 470, the first component and the at least one second component are shifted in consideration of the obtained phase information at block 460. In some embodiments, the system 310 shifts the fundamental wave to a predetermined phase, angle, for example 0°, and records the phase angle that is shifted. It is to be understood that the predetermined phase angle can be any appropriate phase angle and the scope of the present disclosure is not limited thereto. Then, the system 310 can shift all other harmonics by a same phase angle as the shifted phase angle of the fundamental wave. That is, the first component and the at least one second component are synchronously shifted. In this way, all components are shifted to unified phase angles, so as to facilitate the system 310 uses these data to efficiently monitor the electrical equipment 301.

Figure 7B:
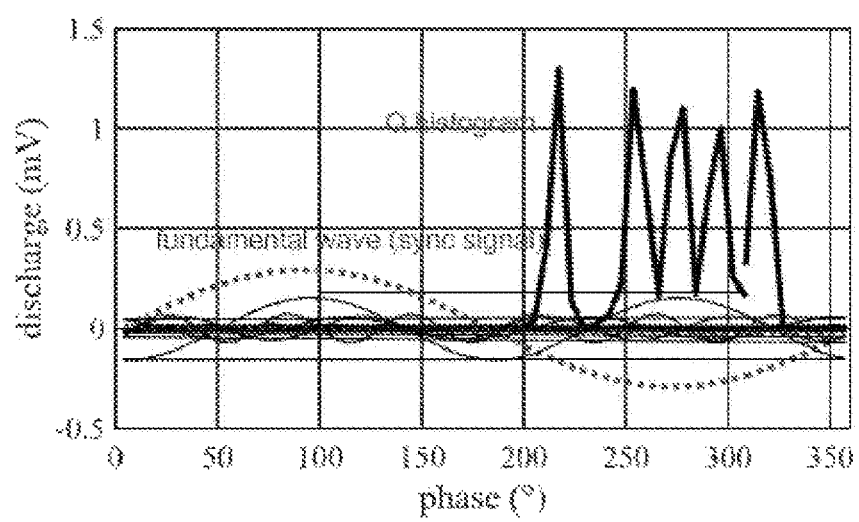
FIG. 7B illustrates a diagram showing a shifted histogram and shifted components in accordance with some example embodiments of the present disclosure.

For example, the shift of the first component and the at least one second component can be seen clearly in FIG. 7A and FIG. 7B. The fundamental wave is represented as a sine wave with a dashed line and all the other sine waves represent the harmonies. The line with several pointed vertices represents a Q histogram before being decomposed. In another words, in FIG. 7A and FIG. 7B, these sine waves are obtained by performing decomposition on the Q histogram. For the purpose of facilitating the observation of the effects of the shift, the histogram and these sine waves are drawn in the same figures.

FIG. 7A shows the states of the first component, the second components, and the Q histogram before being shifted. The first component, the second components, and the Q histogram may have arbitrary phase angles, because at block 420 only the frequency of the grid is obtained without obtaining the synchronizing signal having phase information from the potential transformer. FIG. 7B shows the shifted components and Q histogram. In this way, the components having arbitrary phase angles can be converted to be the components having uniform phase angles. The use of such components can improve the efficiency of monitoring.

Still in reference to FIG. 4, at block 480, the system 310 compares the shifted first and second components with their counterparts and generates a signal indicating a health state of the electrical equipment 301 based on a result of the comparison. In some embodiments, the counterparts are associated with an unhealthy electrical equipment. The signal represents similarity between the shifted components and their counterparts. The similarity can be determined by any appropriate method, for example Euclidian distance method, etc.

In some embodiments, the counterparts of the components can be obtained by performing the same processing as described above on the reference data. The reference data are stored in the reference database. The reference data include, but are not limited to, at least one of PRPD images, histograms, coefficients, or magnitude and phase information. The reference data were obtained, in advance in experiments and are associated with at least one unhealthy state of the electrical equipment 301.

For example, if the reference data comprise PRPD images associated with at least one unhealthy state of the electrical equipment 301, the processes 440-470 are also performed on the reference data. Thus the counterparts of the first component and the second component are obtained. On the same principle, if the reference data comprise histograms associated with at least one unhealthy state of the electrical equipment 301, the processes 450-470 are performed on the reference data, if the reference data comprise coefficients associated with at least one unhealthy state of the electrical equipment 301, the processes 460 and 470 are performed on the reference data, if the reference data comprise raw magnitude and phase information of components associated with at least one unhealthy state of the electrical equipment 301, the process 470 is performed on the reference data, if the reference data comprise shifted magnitude and phase information of components associated with at least one unhealthy state of the electrical equipment 301, the system 310 can, directly compare the shifted first and second components with the reference data. In this way, the system 310 can simply match the phase angles and magnitudes of the counterparts with the shifted components to improve monitoring accuracy.

In some embodiments, the signal can represent a value. For example, if the components are very similar to their counterparts, the value is higher. Once the value exceeds a threshold, the electrical equipment 301 can be considered to be defective, i.e., in an unhealthy state. It is to be understood that the threshold can comprise any appropriate value, and be obtained empirically or experimentally.

In some embodiments, the reference data are associated with one or more properties of the unhealthy electrical equipment 301. For example, the one or more properties at, least comprise a type of a partial discharge generating the partial discharge impulses and/or a location where a partial discharge occurs. If the signal indicates that the shifted components of the detected partial discharge impulses are very similar to their counterparts, the electrical equipment 301 is in an unhealthy state. Because these counterparts are obtained from the reference data, one or more properties associated with the unhealthy electrical equipment 301 can be determined. In this way, the system 310 can directly determine the type of fault (for example, the partial discharge) or the location of the fault if the electrical equipment 301 is in an unhealthy state.

In some embodiments, in order to improve the accuracy of monitoring, the system 310 can monitor a cumulative health state of the electrical equipment 301 over a period of time. For example, the system 310 can perform the above processes 410-480 a plurality of times over a period of time, and generate a plurality of signals indicating the health state of the electrical equipment 301. The plurality of signals can represent a plurality of values. The system 310 can compare each value of the plurality of values with the threshold. If one value exceeds the threshold, the system 310 adds a first count by one. The first count can be associated with, the unhealthy state of the electrical equipment 301. If the value is lower than the threshold, system 310 adds a second count by one. The second count can be associated with the healthy state of the electrical equipment 301. After all of the values are compared with the threshold, the system 310 can generate a ratio indicating a cumulative health state of the electrical equipment 301 over a period of time. The ratio can be a ratio of the first count to the sum of the first count and the second count. If this ratio is high, the electrical equipment is in an unhealthy state over a period of time. Alternatively, the ratio can be a ratio of the second count to the sum of the first count and the second count. If this ratio is low, the electrical equipment is in an unhealthy state over a period of time. In this way, the system 310 can monitor the accumulated health state of the electrical equipment 301, thereby avoiding an incorrect health state indicated by the system 310 due to some detection errors.

Figure 8:
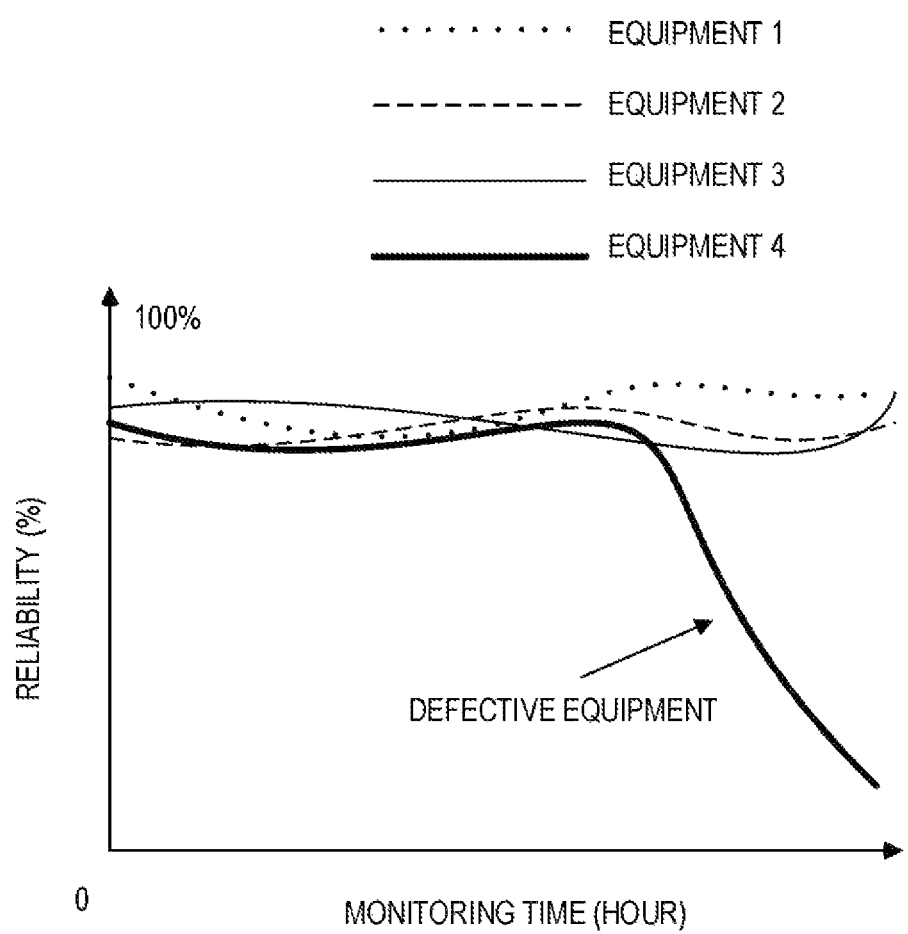
FIG. 8 illustrates a diagram showing an example of an observation time window in accordance with some example embodiments of the present disclosure.

In some embodiments, in order to provide a more intuitive monitoring manner to operators, an observation time window can be displayed in a screen. FIG. 8 illustrates an example of the observation time window associated with four sets of electrical equipment. As shown in the FIG. 8, the horizontal axis represents monitoring time, the vertical axis represents a ratio indicating reliability (for example a cumulative health state) of the electrical equipment. The four curves represent four cumulative health states of four sets of electrical equipment, respectively.

In this example, higher ratio indicates that the electrical equipment is more reliable (for example in a healthy state). A slight toggle of the curve indicates that the electrical equipment is in a relatively healthy state. If the trend of a curve is always at a lower level or gradually decreases from a level, the electrical equipment corresponding to this curve is in an unhealthy state over a period of time. In this way, the operators can intuitively observe the health states of different sets of electrical equipment.

Generally, various embodiments of the present disclosure may be implemented in hardware or special purpose circuits, software, logic or any combination thereof. Some aspects may be implemented in hardware, while other aspects may be implemented in firmware or software which may be executed by a controller, microprocessor or other computing device. While various aspects of embodiments of the present disclosure are illustrated and described as block diagrams, flowcharts, or using some other pictorial representation, it will be appreciated that the blocks, apparatus, systems, techniques or methods described herein may be implemented in, as non-limiting examples, hardware, software, firmware, special purpose circuits or logic, general purpose hardware or controller or other computing devices, or some combination thereof.

The present disclosure also provides at least one computer program product tangibly stored on a non-transitory computer readable storage medium. The computer program product includes computer-executable instructions, such as those included in program modules, being executed in a device on a target real or virtual processor, to carry out the process or method as described above with reference to FIG. 4. Generally, program modules include routines, programs, libraries, objects, classes, components, data structures, or the like that perform particular tasks or implement particular abstract data types. The functionality of the program modules may be combined or split between program modules as desired in various embodiments. Machine-executable instructions for program modules may be executed within a local or distributed device. In a distributed device, program modules may be located in both local and remote storage media.

Program code for carrying out methods of the present disclosure may be written in any combination of one or more programming languages. These program codes may be provided to a processor or controller of a general purpose computer, special purpose computer, or, other programmable data processing apparatus, such that the program codes, when executed by the processor or controller, cause the functions/operations specified in the flowcharts and/or block diagrams to be implemented. The program code may execute entirely on a machine, partly on the machine, as a stand-alone soft-ware package, partly on the machine and partly on a remote machine or entirely on the remote machine or server.

The above program code may be embodied on a machine readable medium, which may be any tangible medium that may contain, or store a program for use by or in connection with an instruction execution system, apparatus, or device. The machine readable medium may be a machine readable signal medium or a machine readable storage medium. A machine readable medium may include but not limited to an electronic, magnetic, optical, electromagnetic, infrared, or semiconductor system, apparatus, or device, or any suitable combination of the foregoing. More specific examples of the machine readable storage medium would include an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

Further, while operations are depicted in a particular order, this should not be understood as requiring that such operations be performed in the particular order shown or in sequential order, or that all illustrated operations be performed, to achieve desirable results. In certain circumstances, multitasking and parallel processing may be advantageous. Likewise, while several specific implementation details are contained in the above discussions, these should not be construed as limitations on the scope of the present disclosure, but rather as descriptions of features that may be specific to particular embodiments, Certain features that are described in the context of separate embodiments may also be implemented in combination in a single embodiment. On the other hand, td various features that are described in the context of a single embodiment may also be implemented in multiple embodiments separately or in any suitable sub-combination.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method for condition monitoring an electrical equipment comprising:
    detecting partial discharge impulses generated in the electrical equipment for at least one power cycle;
    obtaining first data representing the detected partial discharge impulses for the at least one power cycle;
    obtaining second data by phase-resolving the first data;
    obtaining third data by regularizing the second data;
    analyzing the third data into a first component and at least one second component;
    obtaining phase information of the first component;
    shifting the first component and the at least one second component in consideration of the obtained phase information; and
    generating a signal indicating a health state of the electrical equipment by comparing the shifted first and second components of the third data with their counterparts associated with an unhealthy electrical equipment.

2. The method of claim 1, wherein the phase information of the first component includes a phase angle of the first component, and wherein shifting the first component and the at least one second component comprises:
    synchronously shifting the first component and the at least one second component to change the phase angle of the first component to a predetermined value.

3. The method of claim 1, wherein obtaining the third data comprises:
    iteratively performing the following one or more times:
        determining a ration between a valley and a peak of magnitudes of the detected partial discharge impulses, the magnitudes being below a reference value;
        if the ratio is inconsistent with a target ratio, decreasing the reference value; and
    de-nosing the partial discharge impulses by removing impulses with the magnitudes below the reference value.

4. The method of claim 1, wherein obtaining the first data comprises:
    obtaining a frequency of a grid in which the electrical equipment operates;

generating a synchronization signal, a frequency of the synchronization signal synchronized with the frequency of the grid; and generating the first data by recording the detected partial discharge impulses and phase information of the synchronization signal corresponding to the detected partial discharge impulses.

5. The method of claim 4, wherein obtaining the frequency of the grid comprises:

performing a Fourier transform on the detected partial discharge impulses; and calculating the frequency of the grid in consideration of a frequency of an impulse with a maximum magnitude among the transformed partial discharge impulses as the frequency of the grid.

6. The method of claim 1, wherein obtaining the second data comprises:

determining, from the first data, phase angles of the partial discharge impulses;

shifting the phase angles of the partial discharge impulses to within one power cycle; and recording the partial discharge impulses and the shifted phase angles to obtain the second data.

7. The method of claim 1, wherein the third data include a histogram of the second data, the histogram representing a distribution of magnitudes of the detected partial discharge impulses over phase angles of the detected partial discharge impulses.

8. The method of claim 1, further comprising:

in response to the signal indicating that the electrical equipment is in an unhealthy state, incrementing a first count of unhealthy states of the electrical equipment over a period of time;

in response to the signal indicating that the electrical equipment is in a healthy state, incrementing a second count of healthy states of the electrical equipment over the period of time; and generating, based on the first count and the second count, a score indicating a cumulative health state of the electrical equipment.

9. The method of claim 1, further comprising:

in response to the signal indicating that the electrical equipment is in an unhealthy state, obtaining one or more properties of the unhealthy electrical equipment; and determining one or more properties of the electrical equipment based on the properties of the unhealthy electrical equipment.

10. The method of claim 9, wherein the one or more properties of the electrical equipment comprise: a type of a partial discharge generating the partial discharge impulses, and/or a location where a partial discharge generating the partial discharge impulses occurs.

11. The method of claim 1, wherein the first component comprises a fundamental wave of the third data, and the at least one second component comprises at least one harmonic of the third data.

12. A system for condition monitoring an electrical equipment comprising:

a processing unit; and a memory coupled to the processing unit and storing instructions thereon, the instructions, when executed by the processing unit, causing the system to:

detect partial discharge impulses generated in the electrical equipment for at least one power cycle;

obtain first data representing the detected partial discharge impulses for the at least one power cycle;

obtain second data by phase-resolving the first data;

obtain third data by regularizing the second data;

analyse the third data into a first component and at least one second component;

obtain phase information of the first component;

shift the first component and the at least one second component in consideration of the obtained phase information; and generate a signal indicating a health state of the electrical equipment by comparing the shifted first and second components of the third data with their counterparts associated with an unhealthy electrical equipment.

13. The system of claim 12, wherein the phase information of the first component includes a phase angle of the first component, and wherein shifting the first component and the at least one second component comprises:

synchronously shifting the first component and the at least one second component to change the phase angle of the first component to a predetermined value.

14. The system of claim 12, wherein obtaining the third data comprises:

iteratively performing the following one or more times:

determining a ration between a valley and a peak of magnitudes of the detected partial discharge impulses, the magnitudes being below a reference value;

if the ratio is inconsistent with a target ratio, decreasing the reference value; and de-nosing the partial discharge impulses by removing impulses with the magnitudes below the reference value.

15. The system of claim 12, wherein obtaining the first data comprises:

obtaining a frequency of a grid in which the electrical equipment operates;

generating a synchronization signal, a frequency of the synchronization signal synchronized with the frequency of the grid; and generating the first data by recording the detected partial discharge impulses and phase information of the synchronization signal corresponding to the detected partial discharge impulses.

16. The system of claim 15, wherein obtaining the frequency of the grid comprises:

performing a Fourier transform on the detected partial discharge impulses; and calculating the frequency of the grid in consideration of a frequency of an impulse with a maximum magnitude among the transformed partial discharge impulses as the frequency of the grid.

17. The system of claim 12, wherein obtaining the second data comprises:

determining, from the first data, phase angles of the partial discharge impulses;

shifting the phase angles of the partial discharge impulses to within one power cycle; and recording the partial discharge impulses and the shifted phase angles to obtain the second data.

18. The system of claim 12, wherein the third data include a histogram of the second data, the histogram representing a distribution of magnitudes of the detected partial discharge impulses over phase angles of the detected partial discharge impulses.

19. The system of claim 12, further comprising:

in response to the signal indicating that the electrical equipment is in an unhealthy state, incrementing a first count of unhealthy states of the electrical equipment over a period of time;

in response to the signal indicating that the electrical equipment is in a healthy state, incrementing a second count of healthy states of the electrical equipment over the period of time; and generating, based on the first count and the second count, a score indicating a cumulative health state of the electrical equipment.

20. The system of claim 12, further comprising:

in response to the signal indicating that the electrical equipment is in an unhealthy state, obtaining one or more properties of the unhealthy electrical equipment; and determining one or more properties of the electrical equipment based on the properties of the unhealthy electrical equipment.

21. The system of claim 20, wherein the one or more properties of the electrical equipment comprise: a type of partial discharge generating the partial discharge impulses, and/or a location where partial discharge generating the partial discharge impulses occurs.

22. The system of claim 12, wherein the first component comprises a fundamental wave of the third data, and the at least one second component comprises at least one harmonic of the third data.

23. An electrical equipment comprising the system according to claim 12, the system configured to condition monitor the electrical equipment.

24. A computer readable medium having instructions stored thereon, the instructions, when executed on at least one processor, cause the at least one processor to implement condition monitoring of an electrical equipment comprising:

detect partial discharge impulses generated in the electrical equipment for at least one power cycle;

obtain first data representing the detected partial discharge impulses for the at least one power cycle;

obtain second data by phase-resolving the first data;

obtain third data by regularizing the second data;

analyze the third data into a first component and at least one second component;

obtain phase information of the first component;

shift the first component and the at least one second component in consideration of the obtained phase information; and generate a signal indicating a health state of the electrical equipment by comparing the shifted first and second components of the third data with their counterparts associated with an unhealthy electrical equipment.

* * * * *